(12) United States Patent
Kaneko et al.

(10) Patent No.: US 12,382,663 B2
(45) Date of Patent: Aug. 5, 2025

(54) SEMICONDUCTOR DEVICE HAVING METAL OXIDE LAYER WITH TAPERED SIDE SURFACE

(71) Applicant: Magnolia White Corporation, Tokyo (JP)

(72) Inventors: Toshiki Kaneko, Tokyo (JP); Fumiya Kimura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 439 days.

(21) Appl. No.: 17/745,953

(22) Filed: May 17, 2022

(65) Prior Publication Data

US 2022/0376076 A1    Nov. 24, 2022

(30) Foreign Application Priority Data

May 19, 2021   (JP) ................................. 2021-084709

(51) Int. Cl.
| H10D 30/67 | (2025.01) |
| H10D 64/01 | (2025.01) |
| H10D 99/00 | (2025.01) |

(52) U.S. Cl.
CPC ......... *H10D 30/6739* (2025.01); *H10D 64/01* (2025.01); *H10D 99/00* (2025.01); *H10D 30/6723* (2025.01); *H10D 30/6755* (2025.01); *H10D 30/6758* (2025.01)

(58) Field of Classification Search
CPC .... H10D 30/6739; H10D 64/01; H10D 99/00; H10D 30/6723; H10D 30/6758; H10D 30/6755

USPC ........................................................... 257/43
See application file for complete search history.

(56) References Cited

U.S. PATENT DOCUMENTS

| 11,024,725 | B2 * | 6/2021 | Yamazaki | ............ H10D 62/405 |
| 2016/0172500 | A1 | 6/2016 | Yamazaki et al. | |
| 2020/0251505 | A1 * | 8/2020 | Watakabe | .......... H10D 30/0321 |
| 2022/0376076 | A1 * | 11/2022 | Kaneko | ............. H01L 29/78633 |
| 2023/0081420 | A1 * | 3/2023 | Suzumura | ............... H10D 86/60 |
| | | | | 257/43 |
| 2023/0387146 | A1 * | 11/2023 | Watakabe | .......... H10D 30/6755 |
| 2024/0421159 | A1 * | 12/2024 | Suzumura | ........... H01L 27/1251 |

FOREIGN PATENT DOCUMENTS

| JP | 2016-197708 A | 11/2016 |
| WO | 2020074993 A1 | 4/2020 |
| WO | 2020089733 A1 | 5/2020 |

OTHER PUBLICATIONS

English machine translation of Office Action dated Sep. 29, 2024 issued in CN Appl. No. 202210538580.4, 10pp.
English machine translation of Chinese Office Action dated Apr. 15, 2024, issued in Chinese Application No. 202210538580.4, 9pp.
English machine translation of Japanese Office Action issued Jan. 28, 2025, in Japanese Patent Application No. 2021-084709.

* cited by examiner

*Primary Examiner* — Jami Valentine Miller
(74) *Attorney, Agent, or Firm* — XSENSUS LLP

(57) ABSTRACT

A semiconductor device includes a substrate, an oxide semiconductor layer over the substrate, a gate insulating layer over the oxide semiconductor layer, a metal oxide layer over the gate insulating layer, and a gate electrode over the metal oxide layer. A first side surface of the metal oxide protrudes from a second side surface of the gate electrode in a plan view.

8 Claims, 12 Drawing Sheets

SEMICONDUCTOR DEVICE HAVING METAL OXIDE LAYER WITH TAPERED SIDE SURFACE

CROSS-REFERENCE TO RELATED APPLICATION

This application is claims the benefit of priority to Japanese Patent Application No. 2021-084709, filed on May 19, 2021, the entire contents of which are incorporated herein by reference.

FIELD

One embodiment of the present invention relates to a semiconductor device including an oxide semiconductor. Further, one embodiment of the present invention relates to a method of manufacturing a semiconductor device including an oxide semiconductor.

BACKGROUND

Recently, a transistor (a semiconductor device) using an oxide semiconductor for a semiconductor layer has been developed in place of amorphous silicon, a low-temperature polysilicon, and a single-crystal silicon (for example, see Japanese laid-open patent publication No. 2016-197708). The semiconductor device using the oxide semiconductor as the semiconductor layer can be manufactured in a simple-structured, low-temperature process similar to a semiconductor device using amorphous silicon as a semiconductor layer. Further, it is known that the semiconductor device using the oxide semiconductor has higher mobility than the semiconductor device using amorphous silicon as the channel. Furthermore, it is known that the semiconductor device using the oxide semiconductor device has a very low off-current.

SUMMARY

A semiconductor device includes a substrate, an oxide semiconductor layer over the substrate, a gate insulating layer over the oxide semiconductor layer, a metal oxide layer over the gate insulating layer, and a gate electrode over the metal oxide layer. A first side surface of the metal oxide protrudes from a second side surface of the gate electrode in a plan view.

A method of manufacturing a semiconductor device includes the steps of forming an oxide semiconductor layer over a substrate, depositing a gate insulating film over the oxide semiconductor layer, depositing a metal oxide film over the gate insulating film, depositing a metal film over the metal oxide film, forming a resist layer over the metal film, and forming a gate electrode and a metal oxide layer by continuously wet etching the metal film and the metal oxide film using the resist layer as a mask.

DESCRIPTION OF EMBODIMENTS

Figure 1:
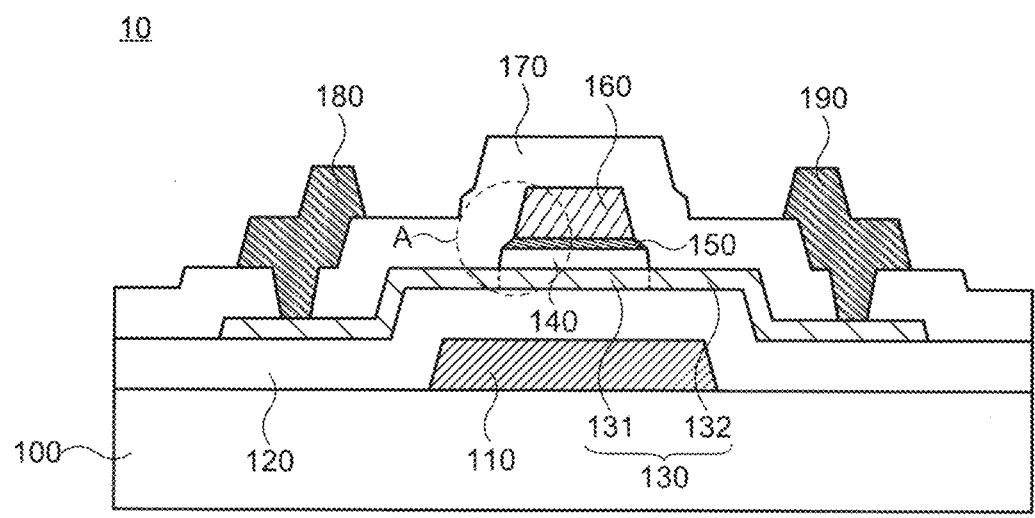
FIG. 1 is a schematic cross-sectional view showing a configuration of a semiconductor device according to an embodiment of the present invention.

In a semiconductor device including an oxide semiconductor, hydrogen or water entering the oxide semiconductor becomes a factor that changes the properties of the oxide semiconductor. Therefore, in order to improve the reliability of the semiconductor device, it is necessary to improve the coverage of the insulating layer covering the oxide semiconductor layer. Further, in order to manufacture a semiconductor device containing an oxide semiconductor at low cost, it has been desired to divert a manufacturing line for a semiconductor device containing amorphous silicon. That is, even in a semiconductor device including an oxide semiconductor, it is necessary to wet etch a metal film using a large-area substrate.

One of the objects of an embodiment of the present invention is to provide a semiconductor device with excellent reliability. Further, one of the objects of an embodiment of the present invention is to provide a semiconductor device that can be manufactured at low cost.

Hereinafter, embodiments of the present invention are described with reference to the drawings. However, the present invention can be carried out in various embodiments while maintaining the gist of the invention, and is not to be construed as being limited to the contents of the embodiments described below. For the sake of clarity of the description, the drawings may be schematically represented with respect to the widths, thicknesses, shapes, and the like of the respective portions in comparison with actual embodiments. However, the schematic drawings are merely examples and are not intended to limit the interpretation of the present invention. Further, in the present specification and drawings, the same or similar elements as those described with respect to the drawings already shown may be designated by the same reference numerals, and duplicate descriptions may be omitted.

In the present invention, when one film is processed to form multiple films, these multiple films may have different functions or roles. However, these multiple films are derived from the same film formed as the same layer in the same process and have the same structure or the same material. Therefore, these multiple films are defined as being in the same layer.

In the present specification, expressions such as "above" and "below" in describing drawings represent the relative position between one structure and the another structure. In the present specification, in the side view, "above" is defined in the direction from a substrate to an electrode and "below" is defined in the opposite direction. In the present specification and the claims, when simply expressing "on" in describing the manner in which the one structure is on the other structure, unless otherwise specified, the expression includes both cases when the other structure is placed directly over one structure so as to be in contact with the structure, and when another structure is placed over the structure via a further different structure.

First Embodiment

[1. Configuration of Semiconductor Device 10]

A configuration of a semiconductor device 10 according to an embodiment of the present invention is described with reference to FIGS. 1 and 2.

FIG. 1 is a schematic cross-sectional view showing a configuration of the semiconductor device 10 according to the embodiment of the present invention. As shown in FIG. 1, the semiconductor device 10 includes a substrate 100, a light shielding layer 110, a first insulating layer 120, an oxide semiconductor layer 130, a gate insulating layer 140, a metal oxide layer 150, a gate electrode 160, a second insulating layer 170, a source electrode 180, and a drain electrode 190.

The light shielding layer 110 is provided on the substrate 100. The first insulating layer 120 covers a side surface and an upper surface of the light shielding layer 110, and is provided on the substrate 100 and the light shielding layer 110. The oxide semiconductor layer 130 is provided on the first insulating layer 120. Further, the oxide semiconductor layer 130 includes a channel region 131 that overlaps the gate insulating layer 140 and a high concentration impurity region 132 that does not overlap the gate insulating layer 140. The gate insulating layer 140 is provided on the oxide semiconductor layer 130. The metal oxide layer 150 is provided on the gate insulating layer 140. The gate electrode 160 is provided on the metal oxide layer 150. The second insulating layer 170 covers a side surface of the gate insulating layer 140, a side surface of the metal oxide layer 150, and a side surface and an upper surface of the gate electrode 160, and covers the first insulating layer 120, the oxide semiconductor layer 130, and is provided on the gate insulating layer 140, the metal oxide layer 150, and the gate electrode 160. Further, the second insulating layer 170 is provided with an opening for exposing a part of an upper surface of the oxide semiconductor layer 130 (more specifically, the high concentration impurity region 132). The source electrode 180 and the drain electrode 190 are provided in the opening of the second insulating layer 170 and on the second insulating layer 170. The source electrode 180 and the drain electrode 190 are in contact with the high-concentration impurity region 132 of the oxide semiconductor layer 130 through the opening of the second insulating layer 170. Therefore, the source electrode 180 and the drain electrode 190 are electrically connected to the oxide semiconductor layer 130.

The semiconductor device 10 includes the oxide semiconductor layer 130 below the gate insulating layer 140 and the gate electrode 160 over the gate insulating layer 140. That is, the semiconductor device 10 is a so-called top gate type transistor.

For example, a rigid substrate having translucency such as a glass substrate, a quartz substrate, or a sapphire substrate can be used as the substrate 100. Further, a rigid substrate having no translucency such as a silicon substrate can also be used as the substrate 100. Furthermore, a flexible substrate having translucency such as a polyimide resin substrate, an acrylic resin substrate, a siloxane resin substrate, or a fluororesin substrate can be used as the substrate 100. Impurities may be introduced into the above resin substrate in order to improve the heat resistance of the substrate 100. The above-mentioned rigid substrate or flexible substrate on which a silicon oxide film or a silicon nitride film is formed can also be used as the substrate 100.

The light shielding layer 110 can reflect or absorb external light. Since the light shielding layer 110 is provided to have an area larger than the channel region 131 of the oxide semiconductor layer 130, it is possible to block external light incident on the channel region 131. For example, aluminum (Al), copper (Cu), titanium (Ti), molybdenum (Mo), tungsten (W), an alloy or compound thereof, or the like can be used as the light shielding layer 110. Further, when the light shielding layer 110 does not require conductivity, it does not necessarily have to contain a metal. For example, a black matrix made of black resin can also be used as the light shielding layer 110. Further, the light shielding layer 110 may have a stacked structure as well as a single-layer structure. For example, the light shielding layer 110 may have a stacked structure of a red color filter, a green color filter, and a blue color filter.

The first insulating layer 120 can prevent the diffusion of impurities into the oxide semiconductor layer 130. That is, the first insulating layer 120 can function as a so-called undercoat layer. For example, silicon oxide or silicon nitride can be used for the first insulating layer 120. Further, the first insulating layer 120 may have a stacked structure as well as a single layer structure. A configuration on which the first insulating layer 120 is not provided can also be applied.

The oxide semiconductor layer 130 can form a channel. For example, an oxide semiconductor such as indium gallium zinc oxide (IGZO), indium tin oxide (ITZO), indium aluminum zinc oxide (IAZO), or zinc oxide (ZnO) can be used for the oxide semiconductor layer 130. It is preferable to use an oxide semiconductor containing indium for the oxide semiconductor layer 130.

For example, silicon oxide, silicon nitride, aluminum oxide, aluminum nitride, or the like can be used for the gate insulating layer 140.

The metal oxide layer 150 can supply oxygen to the oxide semiconductor layer 130 via the gate insulating layer 140 or prevent oxygen from being extracted from the oxide semiconductor layer 130 via the gate insulating layer 140. For example, the above-mentioned oxide semiconductor or an oxide conductor such as indium tin oxide (ITO), indium tin oxide (IZO), aluminum zinc oxide (AZO), or zinc gallium oxide (GZO) can be used for the metal oxide layer 150. Hereinafter, for convenience, the oxide semiconductor and the oxide conductor included in the metal oxide layer may be described as a metal oxide.

For example, copper (Cu), aluminum (Al), titanium (Ti), chromium (Cr), cobalt (Co), nickel (Ni), molybdenum (Mo), hafnium (Hf), tantalum (Ta), tungsten (W), or Bismus (Bi), or alloys or compounds thereof can be used for the gate electrode 160. The gate electrode 160 may have a stacked structure as well as a single-layer structure. The gate electrode 160 preferably includes aluminum, and preferably has, for example, a stacked structure of molybdenum/aluminum/molybdenum. That is, it is preferable that a molybdenum film is provided in contact with the metal oxide layer 150, and an aluminum film is provided on the molybdenum film.

The second insulating layer 170 can reduce the influence from the outside (for example, moisture). The second insulating layer 170 can function as a so-called protective layer. For example, silicon oxide or silicon nitride can be used as the second insulating layer 170. Further, the second insulating layer 170 may have a stacked structure as well as a single layer structure.

For example, copper (Cu), aluminum (Al), titanium (Ti), chromium (Cr), cobalt (Co), nickel (Ni), molybdenum (Mo), hafnium (Hf), tantalum (Ta), tungsten (W), or bismuth (Bi), or alloys or compounds thereof can be used for each of the source electrode 180 and the drain electrode 190. Each of the source electrode 180 and the drain electrode 190 may have a single-layer structure or a stacked structure. Each of the source electrode 180 and the drain electrode 190 may have the same structure as the gate electrode 160.

Figure 2:
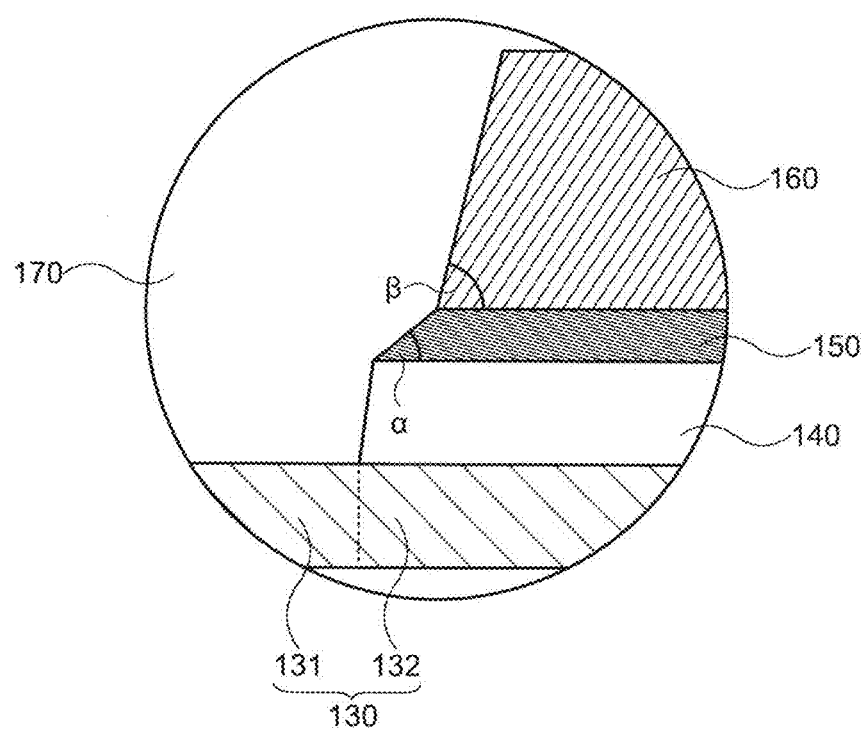
FIG. 2 is a schematic enlarged cross-sectional view showing a configuration of a semiconductor device according to an embodiment of the present invention.

FIG. 2 is a schematic enlarged cross-sectional view showing a configuration of the semiconductor device 10 according to the embodiment of the present invention. Specifically, FIG. 2 is an enlarged view of a region A shown in FIG. 1.

The side surface of the metal oxide layer 150 protrudes from the side surface of the gate electrode 160 in a plan view. Further, a taper angle α of the side surface of the metal oxide layer 150 (an angle formed by a lower surface and the side surface of the metal oxide layer 150) is smaller than a taper angle β of the side surface of the gate electrode 160 (an angle formed by a lower surface and the side surface of the gate electrode 160). That is, the side surface of the metal oxide layer 150 has a more gradual slope than the side surface of the gate electrode 160. Therefore, the coverage performance of the second insulating layer 170 that covers the side surface of the metal oxide layer 150 and the side surface of the gate electrode 160 is improved. As a result, the moisture entering the oxide semiconductor layer 130 through the second insulating layer 170 is suppressed, so that the reliability of the semiconductor device 10 can be improved.

The taper angle α is, for example, greater than or equal to 30 degrees and less than or equal to 70 degrees. When the taper angle α is too small, the gate insulating layer 140 becomes large, which makes it difficult to miniaturize the semiconductor device 10. Further, when the taper angle α is too large, the coverage performance of the second insulating layer 170 deteriorates. Therefore, the taper angle α is preferably in the above range. The taper angle α also depends on the film thickness of the metal oxide layer 150. For example, as the film thickness of the metal oxide layer 150 increases, the taper angle α also increases. Therefore, in order to control the taper angle α within the above range, the film thickness of the metal oxide layer 150 is preferably greater than or equal to 10 nm and less than or equal to 100 nm, and more preferably greater than 20 nm and less than or equal to 50.

[2. Manufacturing Method of Semiconductor Device 10]

A method of manufacturing the semiconductor device 10 according to the embodiment of the present invention is described with reference to FIGS. 3A to 3G.

Each of FIGS. 3A to 3G is a schematic cross-sectional view showing a method of manufacturing the semiconductor device 10 according to the embodiment of the present invention.

Figure 3A:
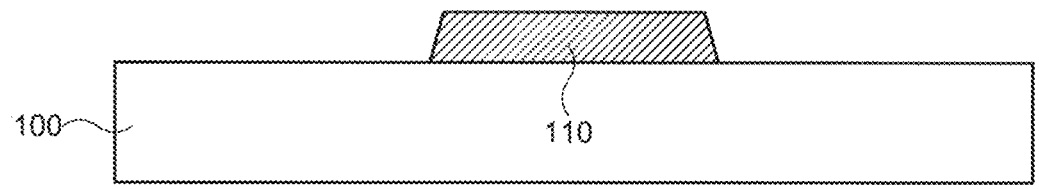
FIG. 3A is a schematic cross-sectional view showing a method of manufacturing a semiconductor device according to an embodiment of the present invention.

FIG. 3A shows a step of forming the light shielding layer 110. For example, a metal film or the like is deposited on the substrate 100 by a sputtering method. Further, the metal film is processed into a predetermined pattern by using a photolithography method to form a light shielding layer 110.

Figure 3B:
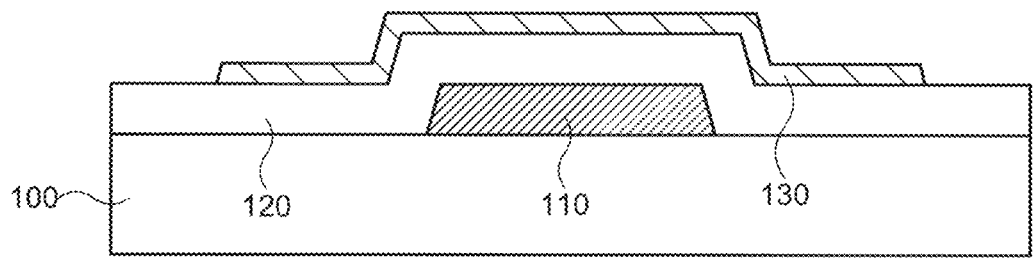
FIG. 3B is a schematic cross-sectional view showing a method of manufacturing a semiconductor device according to an embodiment of the present invention.

FIG. 3B shows steps of forming the first insulating layer and the oxide semiconductor layer 130. A silicon oxide film, a silicon nitride film, or the like is deposited on the substrate 100 and the light shielding layer 110 by a CVD method to form a first insulating layer 120. Further, an oxide semiconductor film is formed on the first insulating layer 120 by a sputtering method. The film thickness of the oxide semiconductor film is, for example, greater than or equal to 20 nm and less than or equal to 100 nm. Further, the oxide semiconductor film is processed into a predetermined pattern by using a photolithography method to form the oxide semiconductor layer 130. In order to improve the electrical characteristics of the semiconductor device 10, it is effective to perform heat treatment of the oxide semiconductor layer 130. Therefore, the heat treatment may be performed after the oxide semiconductor film is formed or after the oxide semiconductor layer 130 is formed. The heat treatment can be performed in an air, dry air atmosphere or a nitrogen atmosphere. The temperature of the heat treatment is greater than or equal to 200° C. and less than or equal to 600° C., preferably greater than or equal to 350° C. and less than or equal to 450° C.

Figure 3C:
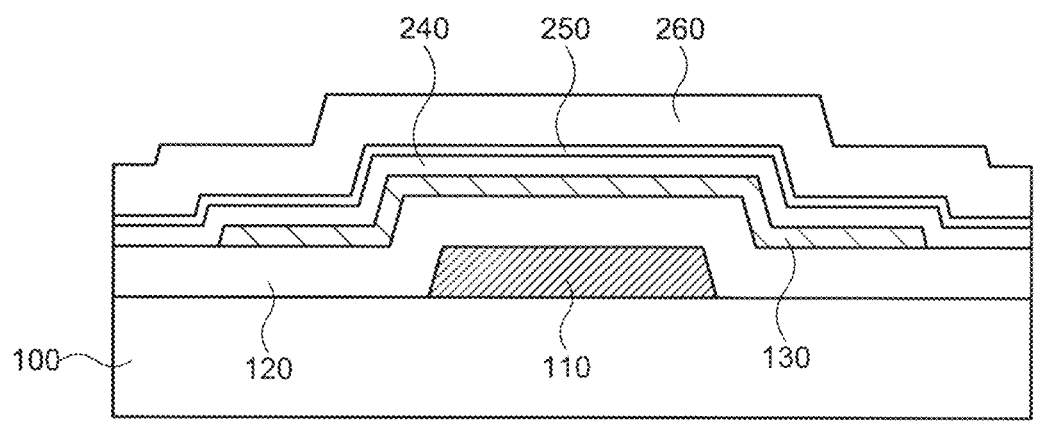
FIG. 3C is a schematic cross-sectional view showing a method of manufacturing a semiconductor device according to an embodiment of the present invention.

FIG. 3C shows steps of forming an insulating film 240, a metal oxide film 250, and a metal film 260. The insulating film 240 such as a silicon oxide film or a silicon nitride film is formed on the first insulating layer 120 and the oxide semiconductor layer 130 by a CVD method. The film thickness of the insulating film 240 is, for example, greater than or equal to 50 nm and less than or equal to 300 nm. Further, the metal oxide film 250 is formed on the insulating film 240 by a sputtering method. Furthermore, the metal film 260 is formed on the metal oxide film 250 by a sputtering method. The metal film 260 preferably includes an aluminum film, and more preferably has a stacked structure of a molybdenum film/aluminum film/molybdenum film. When the metal film 260 has the stacked structure of a molybdenum film/aluminum film/molybdenum film, for example, the film thickness of the molybdenum film is greater than or equal to 20 nm and less than or equal to 100 nm, and the film thickness of the aluminum film is greater than or equal to 300 nm and less than or equal to 700 nm.

Figure 3D:
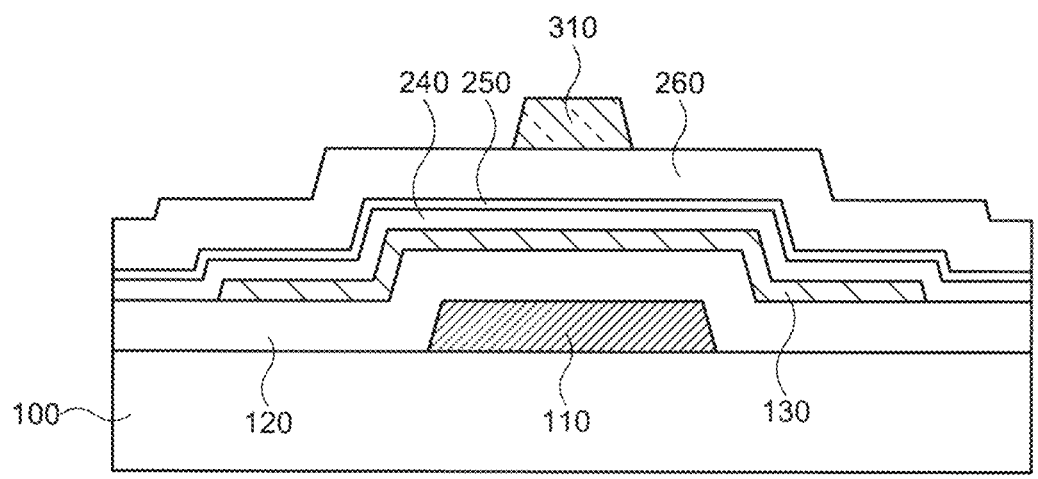
FIG. 3D is a schematic cross-sectional view showing a method of manufacturing a semiconductor device according to an embodiment of the present invention.

FIG. 3D shows a step of forming the resist layer 310 having a predetermined pattern. A resist film is formed on the metal film 260. Further, the resist film is exposed with a photomask and then developed to form the resist layer 310 having the predetermined pattern.

Figure 3E:
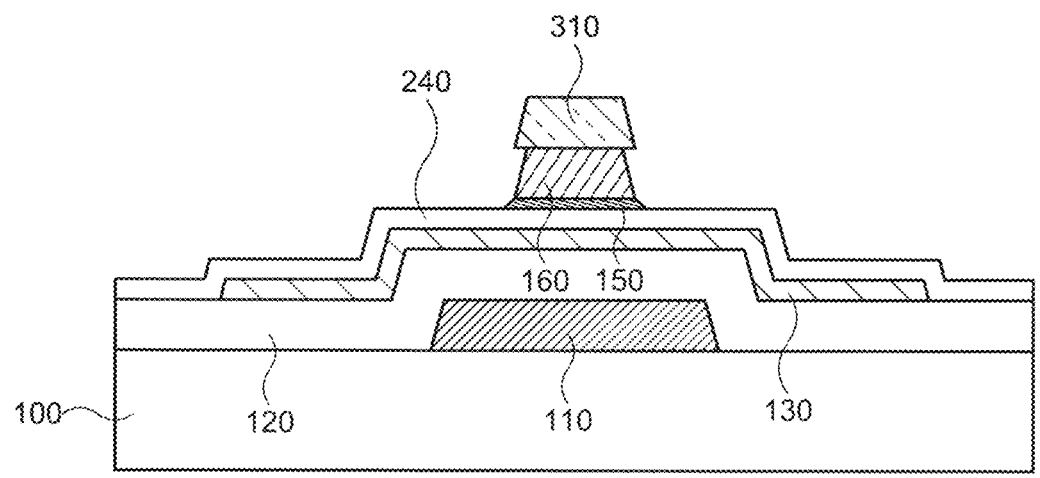
FIG. 3E is a schematic cross-sectional view showing a method of manufacturing a semiconductor device according to an embodiment of the present invention.

FIG. 3E shows steps of forming the gate electrode 160 and the metal oxide layer 150. Using the resist layer 310 as a mask, the metal film 260 and the metal oxide film 250 are continuously wet etched to form the gate electrode 160 and the metal oxide layer 150. Here, "continuously wet etching" means etching a plurality of films at once using the same etching solution. The etching solution preferably contains phosphoric acid, and more preferably contains phosphoric acid, nitric acid, and acetic acid (hereinafter, the etching solution used in this step is referred to as "an etching solution containing phosphoric acid as a main component"). It is known that the etching solution containing phosphoric acid as a main component is used for an aluminum film, a molybdenum film, or the like. In contrast, the etching solution containing phosphoric acid as a main component has a high etching rate for a single metal oxide film. Therefore, it is difficult to control the etching of a single metal oxide film using the etching solution containing phosphoric acid as a main component. However, when the stacked structure in which the metal film 260 is formed on the metal oxide film 250 is etched with the etching solution containing phosphoric acid as a main component, the etching rate of the metal oxide film 250 becomes lower than the etching rate of the metal film 260. Therefore, due to the difference in etching rate between the metal film 260 and the metal oxide film 250, side etching (or an undercut) of the metal oxide film 250 does not occur as shown in FIG. 3E, and a structure in which the side surface of the metal oxide layer 150 protrudes from the side surface of the gate electrode 160 is obtained. Further, the taper angle of the side surface of the metal oxide layer 150 is smaller than the taper angle of the side surface of the gate electrode 160.

When the gate electrode 160 has the stacked structure of a molybdenum film/aluminum film/molybdenum film, the taper angle α on the side surface of the metal oxide layer 150 is preferably smaller than the taper angle on the side surface of the molybdenum film in contact with the metal oxide layer 150 of the gate electrode 160. Further, the taper angle α on the side surface of the metal oxide layer 150 is preferably smaller than the taper angle on the side surface of the aluminum film.

Figure 3F:
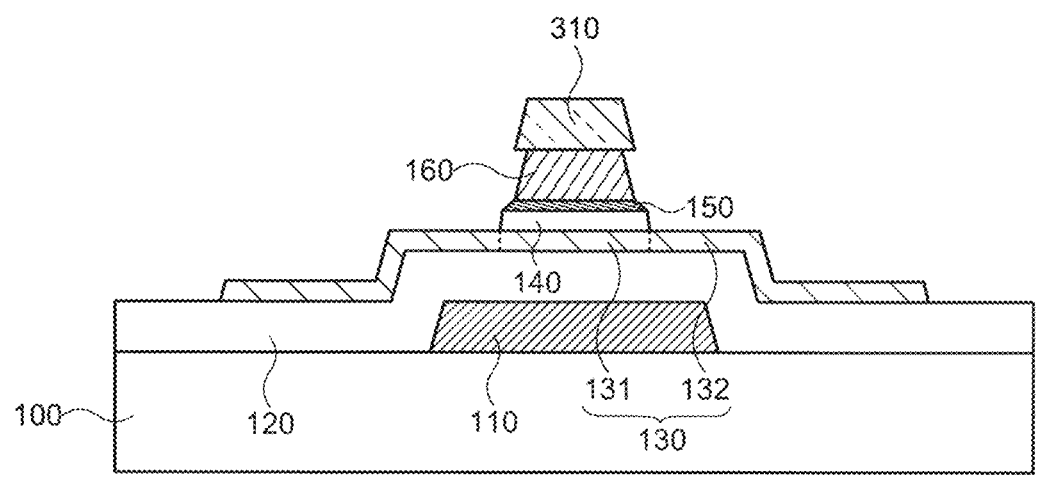
FIG. 3F is a schematic cross-sectional view showing a method of manufacturing a semiconductor device according to an embodiment of the present invention.

FIG. 3F shows a step of forming the gate insulating layer 140. Using the resist layer 310, the gate electrode 160, or the metal oxide layer 150 as a mask, dry etching is performed to form the gate insulating layer 140.

Figure 3G:
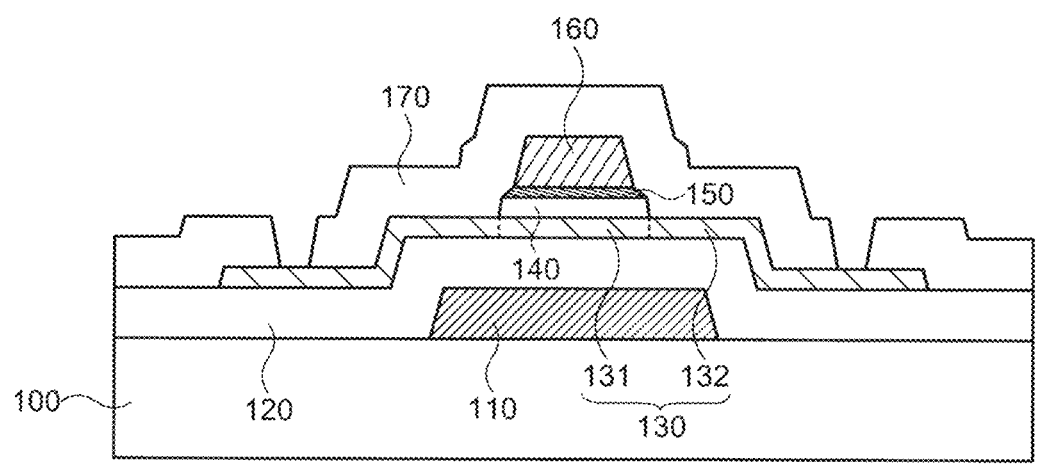
FIG. 3G is a schematic cross-sectional view showing a method of manufacturing a semiconductor device according to an embodiment of the present invention.

FIG. 3G shows a step of forming the second insulating layer 170. After peeling off the resist layer 310, an insulating film such as a silicon oxide film or a silicon nitride film is deposited on the first insulating layer 120, the oxide semiconductor layer 130, the gate insulating layer 140, the metal oxide layer 150, and the gate electrode 160 by the CVD method. At this time, the high concentration impurity region 132 is formed in a region of the oxide semiconductor layer 130 in contact with the insulating film due to the generation of oxygen defects or the addition of impurities. Further, the channel region 131 is formed in a region of the oxide semiconductor layer 130 overlapping the gate insulating layer 140. In addition, using a photolithography method, an opening is formed at a predetermined position of the insulating film so as to expose the upper surface of the oxide semiconductor layer 130 (more specifically, the high concentration impurity region 132), and the second insulating layer 170 is formed.

Then, a metal film is formed, and the metal film is processed into a predetermined pattern by using photolithography to form the source electrode 180 and the drain electrode 190 (see FIG. 1).

As described above, in the semiconductor device 10 according to the present embodiment, the metal oxide layer 150 is formed between the gate insulating layer 140 and the gate electrode 160, so that the slope of the surface connecting the upper surface of the gate insulating layer 140 to the side surface of the gate electrode 160 can be more gradual. Therefore, it is possible to improve the coverage of the second insulating layer 170 that covers the oxide semiconductor layer 130 and the gate electrode 160. Further, the metal oxide layer 150 can be formed by continuous wet etching together with the gate electrode 160. Therefore, the semiconductor device 10 can be manufactured at low cost because each electrode can be formed on a large-area substrate by wet etching.

Second Embodiment

[1. Configuration of Semiconductor Device 10A]

A configuration of the semiconductor device 10A according to an embodiment of the present invention is described with reference to FIG. 4. When the configuration of the semiconductor device 10A is the same as the configuration of the semiconductor device 10 described in the first embodiment, the description of the configuration of the semiconductor device 10A may be omitted.

Figure 4:
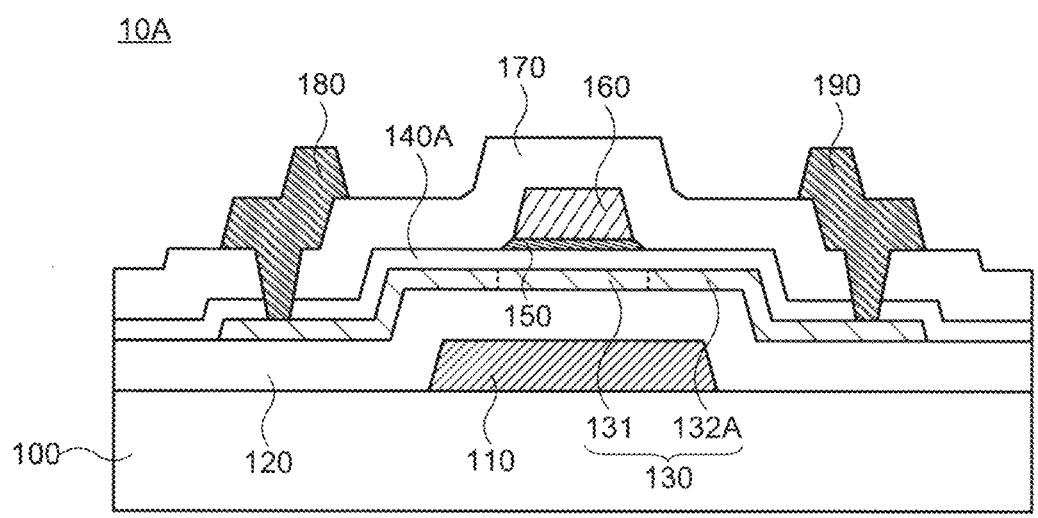
FIG. 4 is a schematic cross-sectional view showing a configuration of a semiconductor device according to an embodiment of the present invention.

FIG. 4 is a schematic cross-sectional view showing a configuration of the semiconductor device 10A according to the embodiment of the present invention. As shown in FIG. 4, the semiconductor device 10A includes the substrate 100, the light shielding layer 110, the first insulating layer 120, the oxide semiconductor layer 130, a gate insulating layer 140A, the metal oxide layer 150, the gate electrode 160, the second insulating layer 170, the source electrode 180, and the drain electrode 190. Further, the oxide semiconductor layer 130 includes the channel region 131 that overlaps the gate electrode 160 and the high concentration impurity region 132A that does not overlap the gate electrode 160.

The gate insulating layer 140A covers the oxide semiconductor layer 130 and is provided on the first insulating layer 120 and the oxide semiconductor layer 130. That is, the side surface of the oxide semiconductor layer 130 is covered with the gate insulating layer 140A. Further, the first insulating layer 120 is provided with an opening for exposing a part of the upper surface of the oxide semiconductor layer 130 (more specifically, the high concentration impurity region 132A). The source electrode 180 and the drain electrode 190 are in contact with the high-concentration impurity region 132A of the oxide semiconductor layer 130 through the opening of the second insulating layer 170 and the opening of the gate insulating layer 140A.

Also in the semiconductor device 10A, the side surface of the metal oxide layer 150 protrudes from the side surface of the gate electrode 160 in a plan view. Further, the taper angle α on the side surface of the metal oxide layer 150 is smaller than the taper angle β on the side surface of the gate electrode 160. That is, the side surface of the metal oxide layer 150 has a more gradual slope than the side surface of the gate electrode 160. Therefore, the coverage performance of the second insulating layer 170 that covers the side surface of the gate electrode 160 is improved. As a result, moisture entering the oxide semiconductor layer 130 through the second insulating layer 170 is suppressed, so that the reliability of the semiconductor device 10A can be improved.

[2. Manufacturing Method of Semiconductor Device 10A]

A method of manufacturing the semiconductor device 10A according to the embodiment of the present invention is described with reference to FIGS. 5A and 5B. When the manufacturing method of the semiconductor device 10A is the same as the manufacturing method of the semiconductor device 10 described in the first embodiment, the description of the manufacturing method of the semiconductor device 10A may be omitted.

Since the steps from FIG. 3A to FIG. 3E are the same in the method of manufacturing the semiconductor device 10A, the description thereof is omitted here, and the subsequent steps are described.

Figure 5A:
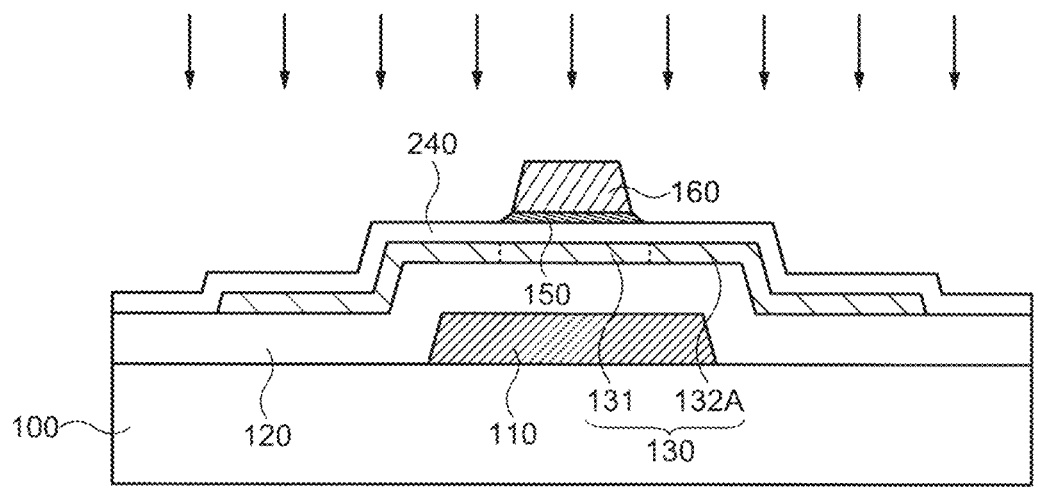
FIG. 5A is a schematic cross-sectional view showing a method of manufacturing a semiconductor device according to an embodiment of the present invention.
Figure 5B:
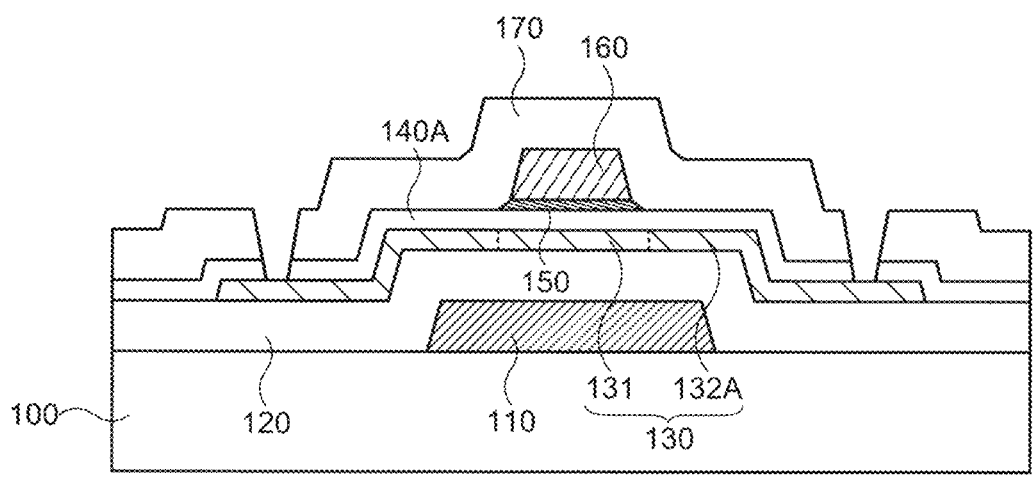
FIG. 5B is a schematic cross-sectional view showing a method of manufacturing a semiconductor device according to an embodiment of the present invention.

Each of FIGS. 5A and 5B is a schematic cross-sectional view showing a method of manufacturing the semiconductor device 10A according to the embodiment of the present invention.

FIG. 5A show a step of forming the high-concentration impurity region 132A. After the resist layer 310 is peeled off, an impurity element is ionically injected into the oxide semiconductor layer 130 via the insulating film 240 using the gate electrode 160 or the metal oxide layer 150 as a mask, and the high concentration impurity region 132A is formed in a region of the oxide semiconductor layer 130 that does not overlap the gate electrode 160. Further, the channel region 131 is formed in a region of the oxide semiconductor layer 130 overlapping the gate electrode 160. Hydrogen, argon, phosphorus, boron or the like can be used as the impurity element. However, the addition of the impurity element to the oxide semiconductor layer 130 mainly generates oxygen defects and controls the conductive type of the conductor, so that the type of the impurity element is not particularly limited to the above element. The concentration (dose amount) of the impurity element is, for example, greater than or equal to $1 \times 10^{14}$ atoms/cm$^2$ and less than or equal to $5 \times 10^{15}$ atoms/cm$^2$. In this case, the high concentration impurity region 132A contains impurity elements at a concentration of greater than or equal to about $5 \times 10^{13}$ atoms/cm$^3$ and less than or equal to $2.5 \times 10^{15}$ atoms/cm$^3$. The concentration of the impurity element contained in the oxide semiconductor layer 130 can be measured by, for example, secondary ion mass spectrometry (SIMS).

FIG. 5B shows a step of forming the gate insulating layer 140A. An insulating film such as a silicon oxide film or a silicon nitride film is deposited on the insulating film 240 by the CVD method. The insulating film and the insulating film 240 is opened at a predetermined position using a photolithography method so as to expose the upper surface of the oxide semiconductor layer 130 (more specifically, the high concentration impurity region 132A) and the second insulating layer 170 and the gate insulating layer 140A is formed.

Then, a metal film is formed, and the metal film is processed into a predetermined pattern by using a photolithography to form the source electrode 180 and the drain electrode 190 (see FIG. 4).

As described above, in the semiconductor device 10A according to the present embodiment, the metal oxide layer 150 is formed between the gate insulating layer 140 and the gate electrode 160, so that the slope of the surface connecting the upper surface of the gate insulating layer 140 and the side surface of the gate electrode 160 can be more gradual. Therefore, it is possible to improve the coverage of the second insulating layer 170 that covers the gate electrode 160. Further, the metal oxide layer 150 can be formed by continuous wet etching together with the gate electrode 160. Therefore, the semiconductor device 10A can be manufactured at low cost because each electrode can be formed on a large-area substrate by wet etching.

The semiconductor device described in the first embodiment and the second embodiment can be applied to a liquid crystal display device, an OLED (Organic Light Emitting Diode) display device, or the like. Further, since the semiconductor device described in the first embodiment and the second embodiment can be manufactured by using a large area substrate, the semiconductor device can be applied not only to a small and medium-sized display device such as a smartphone but also to a large display device such as a television.

Additions, deletion, or design changes of constituent elements, or additions, omissions, or changes to conditions of steps as appropriate based on a semiconductor device which is described as an embodiment and an example of the present invention are also included within the scope of the present invention as long as the gist of the present invention is provided. Further, each of the embodiments described above can be appropriately combined and implemented as long as they do not contradict each other.

In addition, other effects of the action which differ from those brought about by each of the above described embodiments, but which are apparent from the description herein or which can be readily predicted by those skilled in the art, are naturally understood to be brought about by the present invention.

What is claimed is:

1. A semiconductor device comprising:
   a substrate;
   an oxide semiconductor layer over the substrate;
   a gate insulating layer over the oxide semiconductor layer;
   a metal oxide layer over the gate insulating layer; and
   a gate electrode over the metal oxide layer,
   wherein a first side surface of the metal oxide protrudes from a second side surface of the gate electrode in a plan view, and
   wherein a first taper angle between the first side surface and a lower surface of the metal oxide layer is smaller than a second taper angle between the second side surface and a lower surface of the gate electrode.

2. The semiconductor device according to claim 1, wherein the first taper angle is greater than or equal to 30 degrees and less than or equal to 70 degrees.

3. The semiconductor device according to claim 1, wherein a thickness of the metal oxide layer is greater than or equal to 10 nm and less than or equal to 100 nm.

4. The semiconductor device according to claim 1, wherein the metal oxide layer comprises indium.

5. The semiconductor device according to claim 1, wherein the gate electrode comprises:
   a first metal layer in contact with the metal oxide layer; and
   a second metal layer over the first metal layer, and
   the second metal layer comprises aluminum.

6. The semiconductor device according to claim 5, wherein the first metal layer comprises molybdenum.

7. The semiconductor device according to claim 1, wherein a side surface of the oxide semiconductor layer is covered with the gate insulating layer.

8. The semiconductor device according to claim 1, wherein the substrate is a flexible substrate.

* * * * *